(12) United States Patent
Tannehill

(10) Patent No.: US 6,841,986 B1
(45) Date of Patent: Jan. 11, 2005

(54) INDUCTIVELY COUPLED DIRECT CONTACT TEST PROBE

(75) Inventor: Joseph W. Tannehill, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/730,416

(22) Filed: Dec. 8, 2003

(51) Int. Cl.[7] .............................................. G01R 27/02
(52) U.S. Cl. ..................................... 324/95; 324/158.1
(58) Field of Search ................................ 324/167, 150, 324/546, 529, 173, 179, 601, 95; 336/40, 77, 133

(56) References Cited

U.S. PATENT DOCUMENTS 5,206,587 A * 4/1993 Rose ...................... 324/207.16
5,793,214 A * 8/1998 Wakamatsu ................. 324/601

* cited by examiner

Primary Examiner—Evan Pert
Assistant Examiner—Trung Q. Nguyen

(57) ABSTRACT

A probe for measuring radio frequency/electromagnetic interference (RF/EMI) is used in combination with a spectrum analyzer or oscilloscope (measuring equipment) to measure and/or test for EMI in electronic equipment. The RF/EMI probe has high dielectric transformer isolation between the input of the measuring equipment and the circuit under test so as to prevent damaging the measuring equipment if a high voltage or current is encountered in the circuit being tested. The RF/EMI probe comprises a measurement tip connected to a shielded sense line, the shielded sense line is electro-magnetically coupled to a toroid forming a RF transformer, a high impedance termination load is connected to the shielded sense line, a shielded coaxial cable having a center conductor connected to a secondary winding on the toroid transformer, the shielded coaxial cable being adapted for connection to an input of the measuring equipment. The shield of the coaxial cable is continuous between the input connector of the measuring equipment and a shielded enclosure surrounding the toroid transformer. The coaxial cable may terminate in a RF connector, e.g., BNC and the like, for quick connection to and disconnection from the measuring equipment.

21 Claims, 3 Drawing Sheets

INDUCTIVELY COUPLED DIRECT CONTACT TEST PROBE

BACKGROUND OF THE INVENTION TECHNOLOGY

1. Field of the Invention

The present invention is related to electromagnetic radio frequency testing of electronic circuits, and more specifically, to the measurement and testing of radio frequency and electromagnetic interference (EMI) signals in electronic equipment without substantially loading the circuit being measured.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as computers and associated storage disk arrays use high speed data and control buses comprising a plurality of printed-circuit traces or conductors on a printed circuit board (PCB) over which high speed (fast rise and fall time) signals, e.g., electrical pulses, travel between the electronic circuits, e.g., microprocessor, memory, programmable logic array (PLA), application specific integrated circuit (ASIC), serial and parallel interfaces and the like, mounted on the printed circuit board. These electrical pulses are comprised of a plurality of high frequency signals that may generate or be degraded by electromagnetic interference (EMI).

EMI of an information handling system may be measured with a spectrum analyzer for displaying radio frequency spectral energy in the frequency domain, and/or a high frequency oscilloscope for displaying radio frequency spectral energy in the time domain. Some type of radio frequency measurement probe is required in combination with either the spectrum analyzer or oscilloscope. Typical probes that may be used for radio frequency measurement are: current clamp, near field, oscilloscope, and resistive.

The current clamp probe is generally used for measuring radio frequency (RF) alternating current (AC) signals traveling in a cable or wire, and this probe inductively (transformer) couples the RF AC signals in the cable or wire to a radio frequency (RF) spectrum analyzer or oscilloscope. The spectrum analyzer displays RF AC signals in the frequency domain and the oscilloscope displays RF AC signals in the tirne domain. The advantages of this probe are good availability, ease in use, accuracy, isolation between the circuit under test and the test instrument, readily adapted for oscilloscopes and/or spectrum analyzers. A disadvantage of the current clamp probe is that it requires an inductively coupled path (must encircle) with the wire or cable carrying the signal of interest.

The near field probe is a specialized probe that may be used with a RF spectrum analyzer or oscilloscope to measure electric and magnetic fields. Advantages of this probe are availability, ease of use, compatible with oscilloscopes and spectrum analyzers. A disadvantage is that it is only useful in finding the general location of EMI, but it is not precise enough to locate the EMI signal on the circuit, such as a specific signal pin or signal line location.

The oscilloscope probe can measure the RF signal precisely, and can be post processed at the oscilloscope to show frequency (EMI) data, but it is cumbersome to use due to the need for a direct connection to the circuit under test and a nearby connection to a ground reference. The ground lead of the oscilloscope probe can accidentally short circuit to an adjacent circuit and cause catastrophic failures of the circuit under test. It is well known to those having ordinary skill in the art of EMI measurements to use circuit voltage readings on an oscilloscope for determining frequency domain signals. Advantages of the oscilloscope probe are availability and accuracy in calibration with the oscilloscope. Disadvantages are the associated ground connection can short to nearby circuits, and the probe requires an expensive oscilloscope to process the voltage signals in order to determine the frequencies of these signals.

Resistive probes may be used in combination with a RF spectrum analyzer or oscilloscope. The resistive probe is designed to couple the RF signals to the spectrum analyzer or oscilloscope. The resistance probe allows accurate measurements of RF signals, however, it is somewhat cumbersome to use, has the potential of shorting to ground, and is not isolated from the measuring instrument for incidental high voltage contact.

What is needed is a simple, accurate, easy to use and safe probe for measuring radio frequency signals, e.g., EMI, associated with electronic circuits and equipment during testing thereof, preferably does not significantly load the circuit under test so as to affect operation thereof and/or EMI test results.

SUMMARY OF THE INVENTION

The present invention remedies the shortcomings of the prior art by providing a RF/EMI probe that may be used in combination with a spectrum analyzer or oscilloscope to reliably and accurately measure and/or test for EMI in electronic equipment e.g., information handling systems. The invention RF/EMI probe combines the usefulness of an EMI current clamp with the versatility of a common, easy to use multimeter probe for viewing frequency domain signals (EMI) on an RF spectrum analyzer, or time domain signals on an oscilloscope. The invention RF/EMI probe allows a direct connection to any circuit of interest without requiring an additional cable or wire connected to the circuit for current pickup purposes. The invention RF/EMI probe is an integrated and isolated RF/EMI probe for making easy and repeatable calibrated measurements without suffering from offending interference from other extraneous signal sources. Due to the invention RF/EMI probe's high impedance and isolation from the signal (inductive), the probe does not substantially affect the operation of the circuit under test because of its very high impedance, and it may contact high voltage circuits without damaging the measuring equipment because of the high dielectric transformer isolation between the input of the measurement instrument and the circuit under test. Thus, the invention probe combines the usefulness of the near field probe and the preciseness of the oscilloscope probe without the possibility of grounding out (shorting) to nearby circuits. A plurality of invention probes may be used in making comparison measurements of RF and/or EMI.

The invention probe may combine two useful tools into one and provide calibrated, repeatable measurements that can be used to precisely identify an EMI signal by comparing the spectrum analyzer reading from a calibrated EMI source to the EMI signal being measured on the circuit under test. This will significantly reduce debug cycles and aid in trouble shooting.

The invention probe comprises a measurement tip connected to a shielded sense line, the shielded sense line is electro-magnetically coupled to a toroid forming a RF transformer, a high impedance termination load connected to the shielded sense line, a shielded coaxial cable having a center conductor connected to a secondary winding on the toroid transformer, the shielded coaxial cable being adapted for connection to an input of a RF spectrum analyzer or oscilloscope (hereinafter "measurement instrument"). The shield of the coaxial cable is continuous between the input connector of the measurement instrument and a shielded enclosure surrounding the toroid transformer. The coaxial cable may terminate in a RF connector, e.g., BNC and the like, for quick connection to and disconnection from the measurement instrument.

Preferably, a shield covers the sense line all the way to the end of a handgrip, leaving only a tip of about ⅛ inch of the sense line exposed from the shielded handgrip/probe and adapted for connection to a circuit under test or measurement. Thus, only a small area (⅛ inch) is left unshielded for possible extraneous signals to be couple into the sense line. The probe tip may protrude even less than ⅛ inch from the surrounding shielded handgrip so long as the sense line can make electrical contact with the circuit under test. Preferably, the toroid secondary winding may be about 10 turns, and, preferably, be terminated with a 50 Ohm resistor in series with this secondary winding. Preferably, the sense line will be terminated with about a one megohm resister so as to present a very high impedance to the circuit under test.

A technical advantage of the present invention is that it combines the usefulness of the near field probe and the preciseness of the oscilloscope probe without the potential for grounding out (shorting) to nearby circuits. Another technical advantage is the ability to contact high voltage circuits without the risk of damaging the measuring equipment because the probe is isolated from the input of the measurement instrument. Another technical advantage is providing calibrated, repeatable measurements that can be used to precisely identify an EMI signal by comparing the spectrum analyzer reading from a calibrated EMI site to the one being measured on the circuit. Still another technical advantage is continuous shielding of the probe so as to minimize pickup of unwanted stray electromagnetic and electrostatic signals and interference. Other technical advantages should be apparent to one having ordinary skill in the art in view of what has been disclosed herein.

BRIEF DESCRIPTION OF THE DRAWINGS

A more complete understanding of the present disclosure and advantages thereof may be acquired by referring to the following description taken in conjunction with the accompanying drawings wherein.

Figure 1:
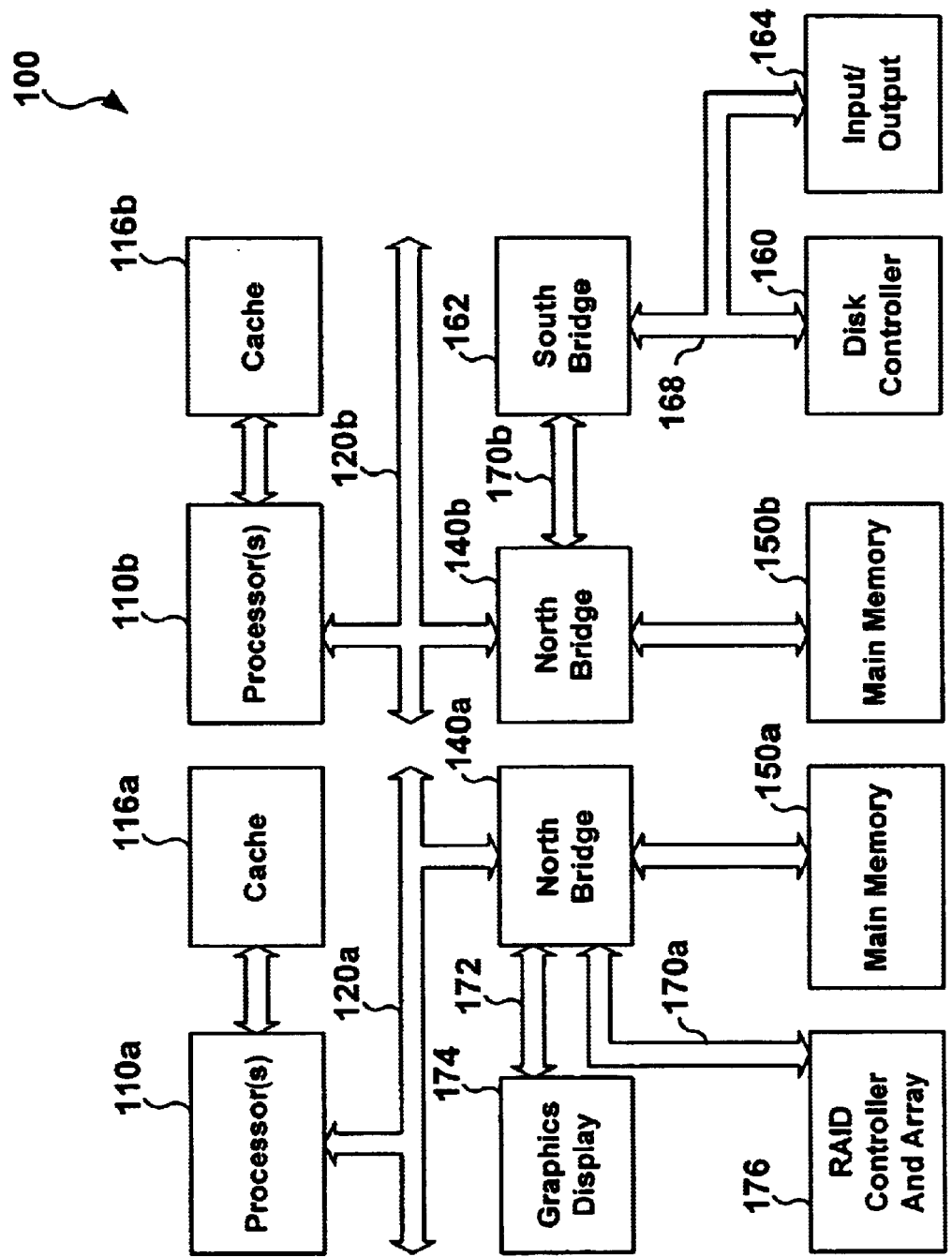
FIG. 1 is a schematic block diagram of an exemplary embodiment of an information handling system.

The present invention may be susceptible to various modifications and alternative forms. Specific exemplary embodiments thereof are shown by way of example in the drawing and are described herein in detail. It should be understood, however, that the description set forth herein of specific embodiments is not intended to limit the present invention to the particular forms disclosed. Rather, all modifications, alternatives, and equivalents falling within the spirit and scope of the invention as defined by the appended claims are intended to be covered.

DETAILED DESCRIPTION OF SPECIFIC EMBODIMENTS

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU), hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of exemplary embodiments of the present invention are schematically illustrated. Like elements in the drawings will be represented by like numbers, and similar elements will be represented by like numbers with a different lower case letter suffix.

Referring to FIG. 1, an information handling system is illustrated having electronic components mounted on at least one PCB and communicating data and control signals therebetween over signal buses which may be comprised of constant impedance electrical conductors. In one embodiment, the information handling system is a computer system. The information handling system, generally referenced by the numeral 100, comprises a processor(s) 10 coupled to a host bus(es) 120 and a cache memory 116. A north bridge(s) 140, which may also be referred to as a "memory controller hub" or a "memory controller," is coupled to a main system memory 150. The north bridge 140 is coupled to the system processor(s) 110 via the host bus(es) 120. The north bridge 140 is generally considered an application specific chip set that provides connectivity to various buses, and integrates other system functions such as memory interface. For example, an Intel 820E and/or 815E chip set, available from the Intel Corporation of Santa Clara, Calif., provides at least a portion of the north bridge 140. The chip set may also be packaged as an application specific integrated circuit ("ASIC"). The north bridge 140 typically includes functionality to couple the main system memory 150 to other devices within the information handling system 100. Thus, memory controller functions such as main memory control functions typically reside in the north bridge 140. In addition, the north bridge 140 provides bus control to handle transfers between the host bus 120 and a second bus, e.g., PCI bus 170, AGP bus 172 (coupled to graphics display 174), etc. The second bus may also include other industry standard buses or proprietary buses, e.g., ISA, SCSI, USB buses 168 through a south bridge (bus interface) 162. These secondary buses 168 may have their own interfaces and controllers, e.g., ATA disk controller 160 and input/output interface(s) 164.

In the information handling system 100, according to the present invention, a PCB(s) is used to mount and electrically interconnect the aforementioned electronic components. High speed digital circuits may be affected by undesirable EMI. To insure consistent and quality information handling systems 100, the present invention may be used to easily and quickly test and/or measure EMI associated therewith.

Figure 2:
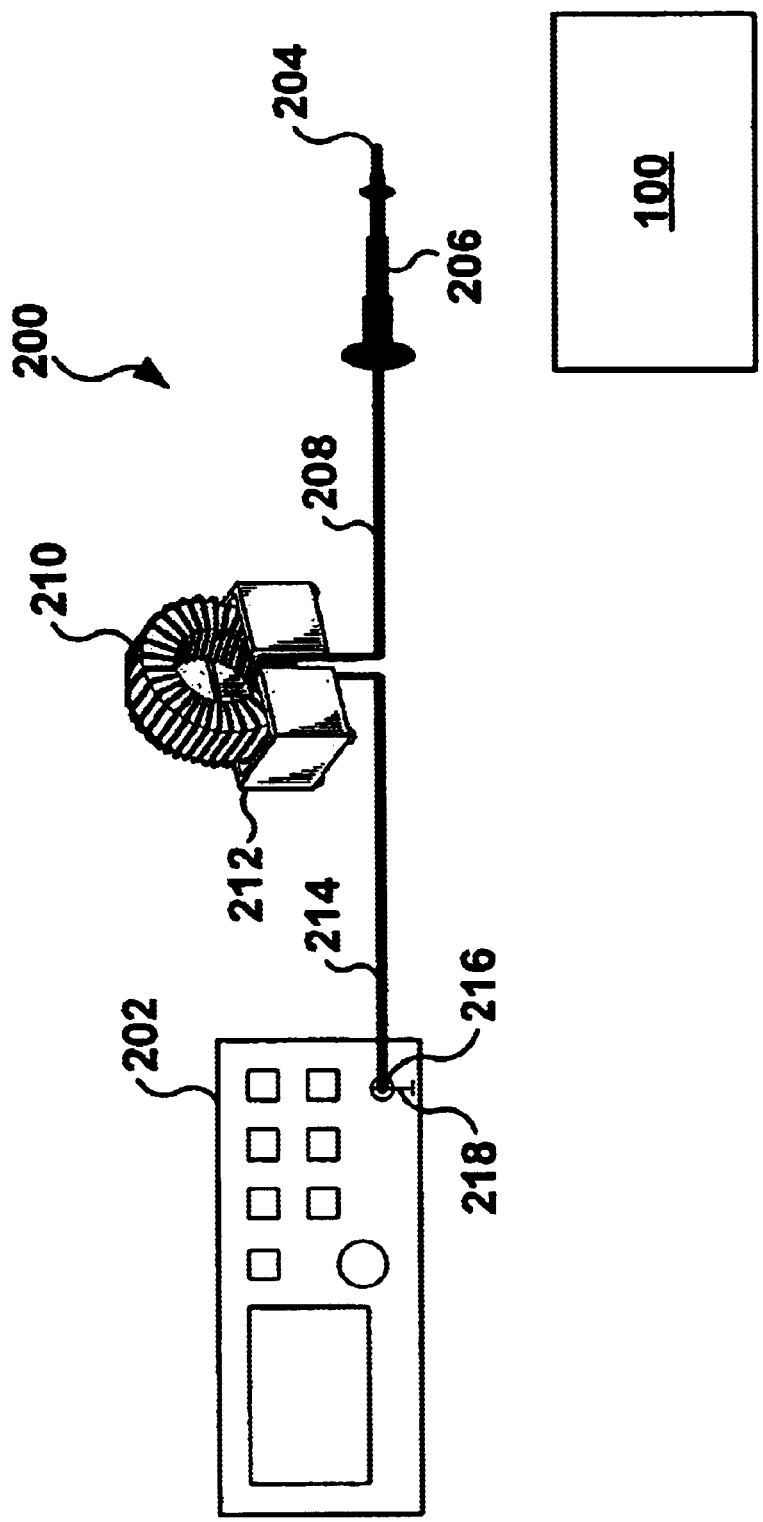
FIG. 2 is a schematic pictorial diagram of a RF/EMI probe, according to an exemplary embodiment of the invention, coupled to a spectrum analyzer.

Referring now to FIG. 2, depicted is a schematic pictorial diagram of a RF/EMI probe, according to an exemplary embodiment of the invention, and a spectrum analyzer. A spectrum analyzer, oscilloscope, etc., (hereinafter measurement equipment) 202 is coupled to a RF/EMI probe, generally represented by the numeral 200. The RF/EMI probe 200 comprises a measurement tip 204 adapted for coupling to circuit test points (not shown) of the information handling system 100, a handgrip 206, a shielded sense line 208, toroid 210 having windings thereon, a shielded enclosure 212 surrounding the toroid 210, and a shielded coaxial cable 214 with a coaxial RF connector 216, e.g., RCA, UHF, F, BNC, TNC, DIN, GR874, C, N, SMA, SMC, APC-7, etc., adapted for quick connection to a mating connector (not shown) at an input of the measurement equipment 202. The connector 216, coaxial cable 214, enclosure 212, sense line 208 and handgrip 206 have commonly connected and grounded shields which may be coupled to a ground reference 218 located at the input of the measurement equipment 202. The measurement tip 204, which is not shielded, need only protrude a sufficient distance from the shielded handgrip 206 for reliable and easy connection to test points of a circuit being measured. Preferably, the measurement tip 204 will be shorter than the RF wavelengths being measured so that substantially no extraneous, unwanted RF/EMI will be coupled into the probe 200 by electromagnetic and/or electrostatic conditions.

Figure 3:
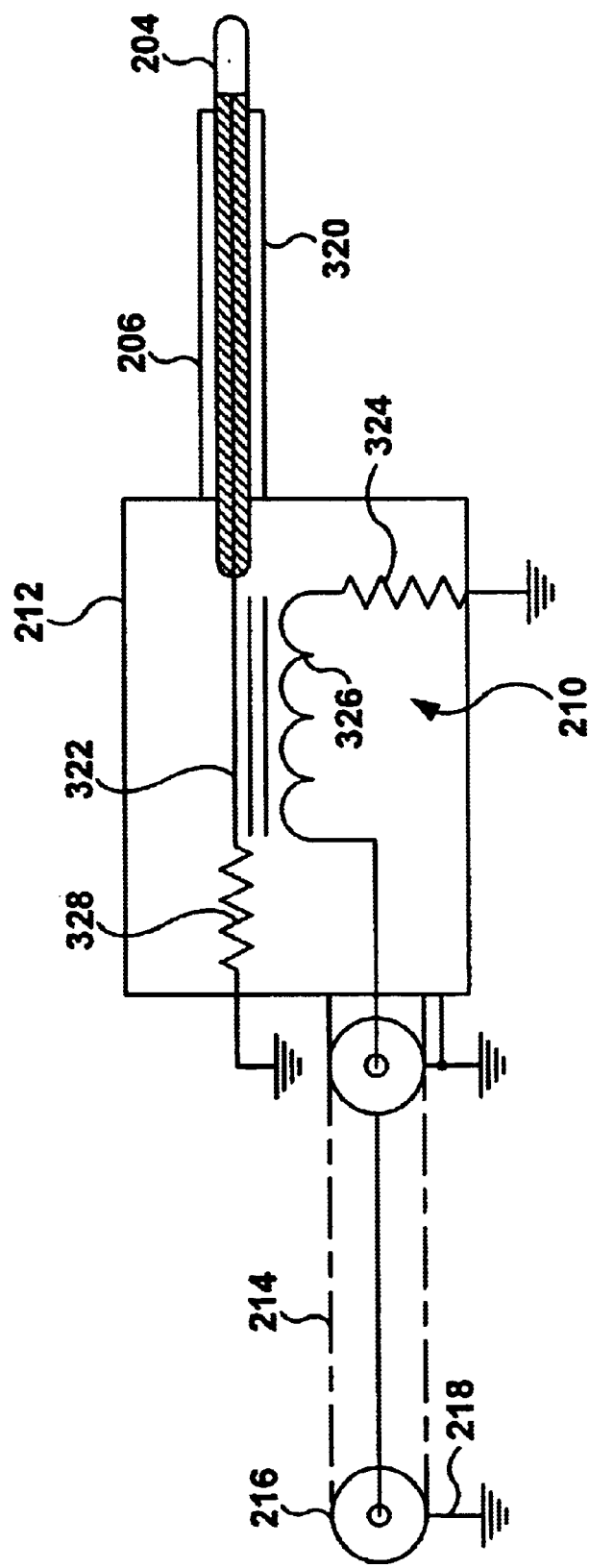
FIG. 3 is a simplified schematic block diagram of the RF/EMI probe illustrated in FIG. 2.

Referring to FIG. 3, depicted is a simplified schematic block diagram of the RF/EMI probe illustrated in FIG. 2. The shielded handgrip 206 is electrically insulated from the sense line 322 with a RF insulator 320. One end of the sense line 322 is coupled to the measurement tip 204 and the other end is coupled to a high resistance termination 328. The high resistance termination 328, preferably, may be about one megohm in value with one end thereof connected to the sense line 322 and the other end thereof connected to a grounded portion of the enclosure 212. It is contemplated and within the scope of the invention that other resistance and/or impedance values may be selected for the termination 328 so long as sufficiently high impedance is achieved for minimizing loading of circuits being tested. The sense line 322 is also electro-magnetically arranged within the toroid 210 to function as a primary winding so as to create a toroid transformer. A secondary winding for the toroid transformer is formed by a secondary winding 326. The secondary winding 326, preferably, may be comprised of about 10 turns of wire. One end of the secondary winding 326 is coupled to a termination resistor 324, and the other end of the secondary winding 326 is coupled to a center conductor of the coaxial cable 214. The termination resistor 324, preferably, may be about 50 ohms, but any other resistance and/or impedance may be used so long as it suitably matches the input impedance of the measurement equipment 202. The toroid 210 and enclosure 212 may be separate from or integral with the handgrip 206. A high degree of electrical isolation between the circuit being measured and the input of the measurement equipment 202 is achieved by using electrically isolated but electromagnetically coupled primary and secondary windings, sense line 322 and secondary winding 326, respectively, on the toroid 210.

The invention, therefore, is well adapted to carry out the objects and to attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are emexplary only, and are not exhaustive of the scope of the invention. Consequently, the invention is intended to be limited only by the spirit and scope of the appended claims, giving full cognizance to equivalents in all respects.

What is claimed is:

1. An inductively coupled direct contact test probe, comprising:

a handgrip comprising an electrically conductive shield;

a measurement tip at a distal end of the handgrip, wherein the measurement tip is electrically isolated from the handgrip shield;

a sense line coupled to the measurement tip, wherein the sense line is inside of the handgrip and electrically isolated front the handgrip shield;

a toroid located at a proximal end Of the handgrip, wherein a portion of the sense line forms a primary winding in electromagnetic communication with the toroid;

a first termination impedance, the first termination impedance being coupled in series with the sense line proximate to the toroid;

a plurality of terms of wire, wherein the plurality of turns of wire form a secondary winding in electromagnetic communication with the toroid;

a second termination impedance, the second termination impedance being coupled in series with the plurality of turns of wire;

a coaxial cable having a center conductor and an outer shield conductor encircling and shielding the center conductor, wherein the center conductor is coupled to the plurality of turns of wire; and a shielded enclosure, wherein the shielded enclosure encloses the toroid, the portion of the sense line, the plurality of turns of wire, the first termination impedance and second termination impedance, whereby the shield of the handgrip, the shielded enclosure and the outer shield conductor of the coaxial cable are connected together to form a substantially continuous electrical shield.

2. The inductively coupled direct contact test probe according to claim 1, wherein the measurement tip is adapted for connection to a circuit under test.

3. The inductively coupled direct contact test probe according to claim 1, wherein an external surface of the electrically conductive shield is electrically insulated.

4. The inductively coupled direct contact test probe according to claim 1, wherein the first termination impedance is a resistance having a value of about one megohm.

5. The inductively coupled direct contact test probe according to claim 1, wherein the second termination impedance is a resistance having a value of about fifty ohms.

6. The inductively coupled direct contact test probe according to claim 1, wherein the plurality of turns of wire are about ten turns of wire.

7. The inductively coupled direct contact test probe according to claim 1, further comprising a coaxial connector on an end of the coaxial cable, wherein the coaxial connector is adapted for connection to an input connector of measurement equipment.

8. The inductively coupled direct contact test probe according to claim 7, wherein the measurement equipment is a spectrum analyzer.

9. The inductively coupled direct contact test probe according to claim 7, wherein the measurement equipment is an oscilloscope.

10. The inductively coupled direct contact test probe according to claim 1, wherein the coaxial connector is selected form the group consisting of RCA, UHF, F, BNC, TNC, DIN, GR874, C, N, SMA, SMC and APC-7.

11. The inductively coupled direct contact test probe according to claim 1, wherein radio frequency signals are measured.

12. The inductively coupled direct contact test probe according to claim 1, wherein said test probe couples radio frequency signals into measurement equipment.

13. The inductively coupled direct contact lest probe according to claim 1, wherein said test probe couples electromagnetic interference signals into measurement equipment.

14. The inductively coupled direct contact test probe according to claim 1, wherein the substantially continuous electrical shield is grounded.

15. The inductively coupled direct contact test probe according to claim 1, wherein an end of the coaxial cable couples the substantially continuous electrical shield to ground.

16. The inductively coupled direct contact test probe according to claim 1, wherein an unshielded portion of the measurement lip length is less than a wavelength of any signal measured.

17. The inductively coupled direct contact test probe according to claim 1, wherein the first termination impedance is of a larger impedance value than the second termination impedance.

18. The inductively coupled direct contact test probe according to claim 1, wherein the first termination impedance is substantially one megohm resistive.

19. The inductively coupled direct contact test probe according to claim 1, wherein the second termination impedance is substantially fifty ohms resistive.

20. The inductively coupled direct contact test probe accord ing to claim 1, wherein the handgrip and the shielded enclosure are integral.

21. The inductively coupled direct contact test probe according to claim 1, wherein the handgrip and the shielded enclosure are separate.

* * * * *